United States Patent
Jussaume et al.

[11] Patent Number: 6,011,449
[45] Date of Patent: Jan. 4, 2000

[54] SURFACE MOUNT TECHNOLOGY CONTACT FOR FERRITE ISOLATOR/CIRCULATOR APPLICATIONS

[75] Inventors: Raymond Gerard Jussaume, Somerville; Stanley Vincent Paquette, Dracut, both of Mass.

[73] Assignee: The Whitaker Corporation, Wilmington, Del.

[21] Appl. No.: 09/025,464

[22] Filed: Feb. 18, 1998

Related U.S. Application Data

[60] Provisional application No. 60/038,844, Feb. 18, 1997.

[51] Int. Cl.$^7$ ............................. H01P 1/387; H05K 5/04
[52] U.S. Cl. ...................... 333/1.1; 174/52.6; 333/24.2
[58] Field of Search ........................... 333/1.1, 24.2, 333/127, 128, 260; 174/52.4, 52.5, 52.6, 59; 257/728; 361/752

[56] References Cited

U.S. PATENT DOCUMENTS

| | | | |
|---|---|---|---|
| 3,277,399 | 10/1966 | Simon | 333/1.1 |
| 4,487,999 | 12/1984 | Baird et al. | 333/260 X |
| 4,839,716 | 6/1989 | Butt | 174/52.4 X |
| 5,294,897 | 3/1994 | Notani et al. | 257/728 X |

FOREIGN PATENT DOCUMENTS

| | | | |
|---|---|---|---|
| 2246114 | 4/1975 | France | 333/1.1 |

*Primary Examiner*—Paul Gensler

[57] ABSTRACT

A structure for a passive microwave device. The structure includes a housing having circumferential side portions and selectively located openings in the side portions. In addition, electrical conductors for the passive device extend from the openings. The structure further includes substantially rigid supports which provide structural support for the conductors. The conductors are positioned above the supports and are electrically connected to contacts which are secured in apertures formed in the supports. A dielectric material is disposed on a perimeter of each of the contacts which serves to isolate each of the contacts from the support when the contact is positioned within the aperture.

8 Claims, 4 Drawing Sheets

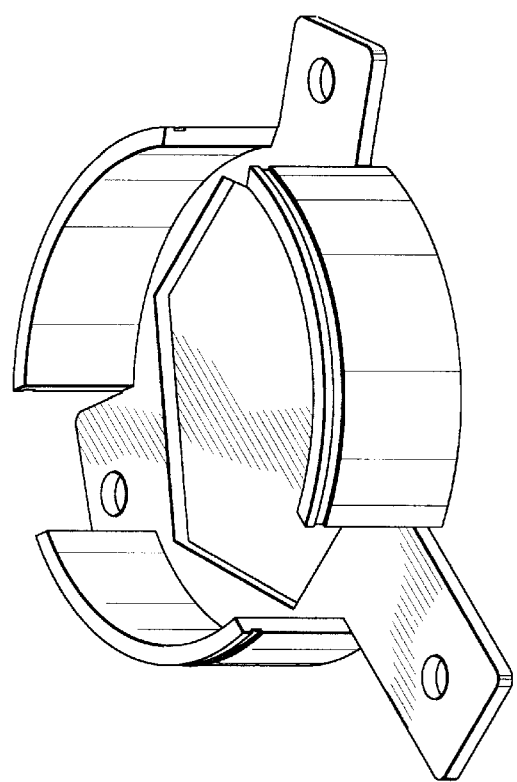
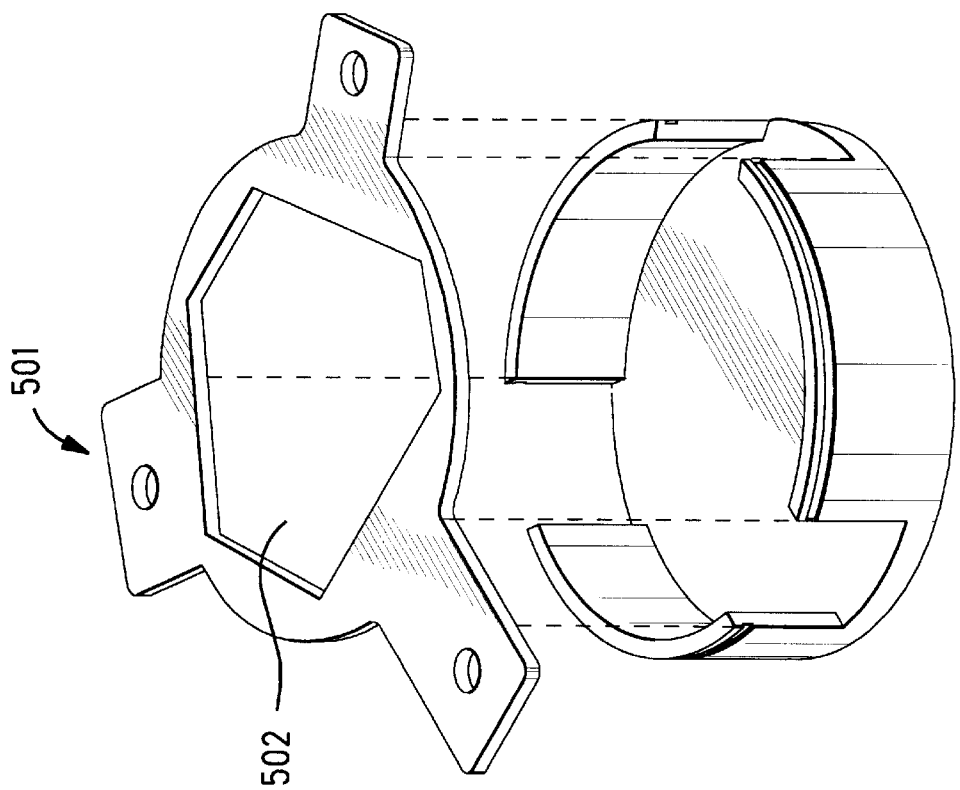
Fig.5B
Fig.5A

SURFACE MOUNT TECHNOLOGY CONTACT FOR FERRITE ISOLATOR/CIRCULATOR APPLICATIONS

This application claims benefit of provisional application No. 60/038,844 filed Feb. 18, 1997.

FIELD OF THE INVENTION

The present invention relates to a robust surface mount contact structure and housing for ferrite isolators/circulators for applications in signal transmission lines, particularly at microwave frequencies.

BACKGROUND OF THE INVENTION

Ferrite Isolators/Circulators have a great deal of applicability in microwave applications. While the design and function of the ferrite isolator/circulator has proven to be reliable and repeatable, the device structure and contacts for connecting the ferrite isolator/circulator to signal transmission lines has proven to have problems from the standpoint of manufacturing and/or ease of installation and subsequent progression into automation. To this end, the conventional structure for a ferrite isolator/circulator is shown in cross section in FIGS. 1a and 1b. The structure shown in FIG. 1a is a typical ferrite housing can 101 with the ferrite isolator/circulator mounted therein having electrical connections for surface mount application such as lead 102 as shown in FIGS. 1a and 1b. The top view of the ferrite can is shown in FIG. 1c with the leads 102 shown for typical applications. Surface mount technology in the microwave industry has wide spread applicability and acceptance. Structures such as shown in FIGS. 1a–1c are designed to be adaptable to surface mount technology. The lead assembly shown in FIG. 1b has the lead 102 designed to rest in the same plane as the bottom of the can as at 103. The purpose of this is to ensure good electrical connection and also ensure that the main housing base has a good electrical contact with its respective contact surface on the PC Board. Although, zero tolerance coplanarity would be ideal, common manufacturing practices allow a certain amount of tolerance of deviation, but more tolerance than would be allowed by typical solder pad thickness deposition from the ferrite to the signal line via lead 102. Thereafter, the lead 102 is soldered via a solder pad to the signal transmission line disposed on the printed circuit board.

While the design shown in FIGS. 1a–1c has met with some success, there are certain drawbacks which have proven problematic with this design. As stated, the industry standard is the use of surface mount technology. Unfortunately, the structure shown in FIGS. 1a–1c requires manual placement of the ferrite cans and contacts as opposed to a automated pick and place method of manufacture due to the lack of coplanarity of the contact leads relative to the base of the housing. Accordingly this slows down the process of manufacture and increases the labor intensity and therefore the overall cost. The reason that manual placement is required is to assure that the leads 102 are properly connected to the signal lines on the printed circuit board and done so in a reliable manner. One of the problems associated with the lead 102 is bending during handling and shipping of the device. The structure shown ideally in FIG. 1b has the lead 102 in the same plane as the bottom of the can at 103. During shipping and handling, the lead as shown can be bent and therefore not properly positioned. The assembly thereafter requires that the lead be rebent to its proper position. Even after the lead is properly bent and placed, there are reliability issues that require further testing time to assure electrical and mechanical integrity of the final product.

Accordingly, what is needed is a structure for ferrite isolator/circulator having a more robust and truly surface mount contact assembly which enables fully automated placement and soldering. Such a structure will enable a greater consistency from unit to unit and affect a more standard product.

SUMMARY OF THE INVENTION

The present invention relates to a more durable and rugged structure for making the electrical connection between a ferrite isolator/circulator disposed in a housing and a signal transmission line disposed on a printed circuit board. The leads for making a contact between the signal line and the ferrite Isolator/Circulator are much more rigid and truly surface mountable enabling fully automated placement and soldering thereafter. The housing structure for the ferrite Isolator/Circulator is metal with the bottom surface of the housing or can having rigid lead supports extending from the metal housing. The ferrite leads are connected to the signal line and are isolated from the ground connection at the bottom of the can by dielectric material disposed between the lead and the lead support structure. Because of the durable and rigid support for the leads from the ferrite circuit to the signal transmission lines on the printed circuit board, it is possible to effect a lead which is coplanar with the bottom of can and therefore effects a truly surface mount structure. A variety of lead assemblies are anticipated with the present invention. The preferred embodiment utilizes a contact lead which is inserted into a dielectric material and thereafter the lead and dielectric are inserted into a hole in the lead support member of the ferrite housing. The resultant product is a truly surface mount technology structure having a robust lead assembly which is readily adaptable to fully automated placement and soldering. The in house processing time of the final product is reduced dramatically due to the more rigid and durable unit and the final product is more consistent from unit to unit.

OBJECTS FEATURES AND ADVANTAGES THE PRESENT INVENTION

It is an object of the present invention to have a surface mount technology ferrite Isolator/Circulator structure which is readily adaptable to automated manufacturing.

It is a further object of the present invention to have a surface mount technology ferrite Isolator/Circulator which is both durable and robust.

It is a feature of the present invention to have a rigid support structure for the electrical leads connecting the ferrite Isolator/Circulator to the signal transmission lines.

It is a further feature of the present invention to have the lead contacts of the ferrite Isolator/Circulator coplanar with the bottom of the housing in a substantially fixed manner.

It is an advantage of the present invention to have a structure which is substantially standard from unit to unit.

BRIEF DESCRIPTION OF THE DRAWINGS

FIGS. 5a and 5b are views of an alternative structure for a support member which is insertable into a standard can housing.

DETAILED DESCRIPTION OF THE INVENTION

Figure 2A:
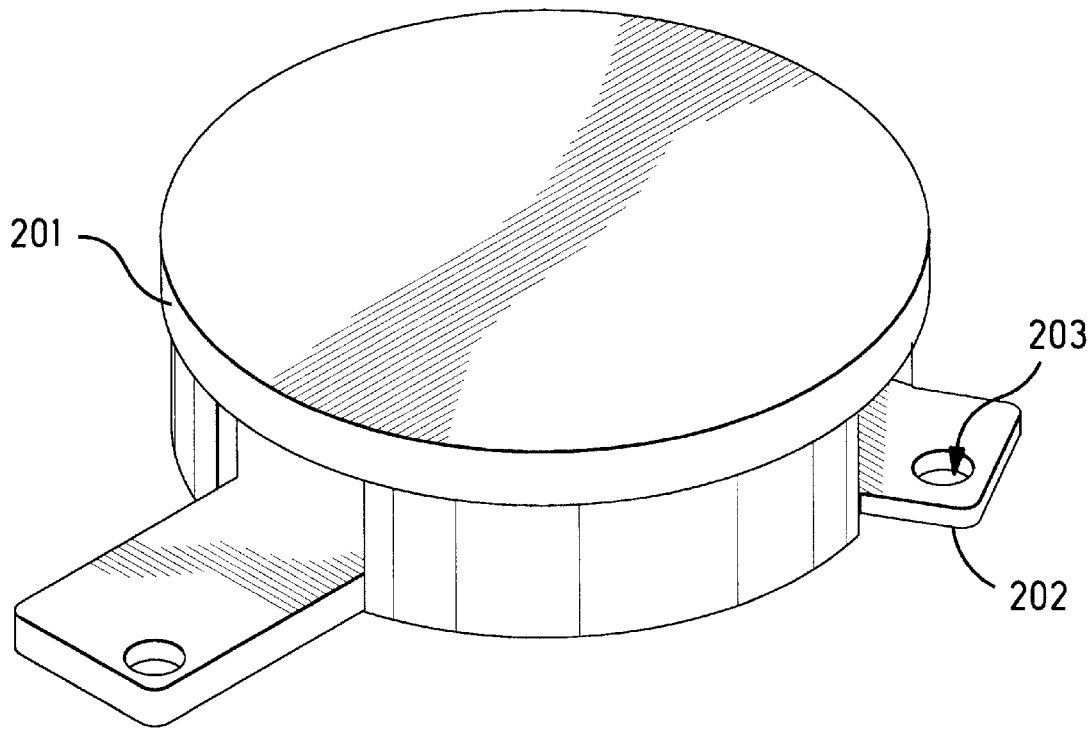
FIGS. 2a and 2b show shows the preferred embodiment of the housing or can structure of the present invention.
Figure 2B:
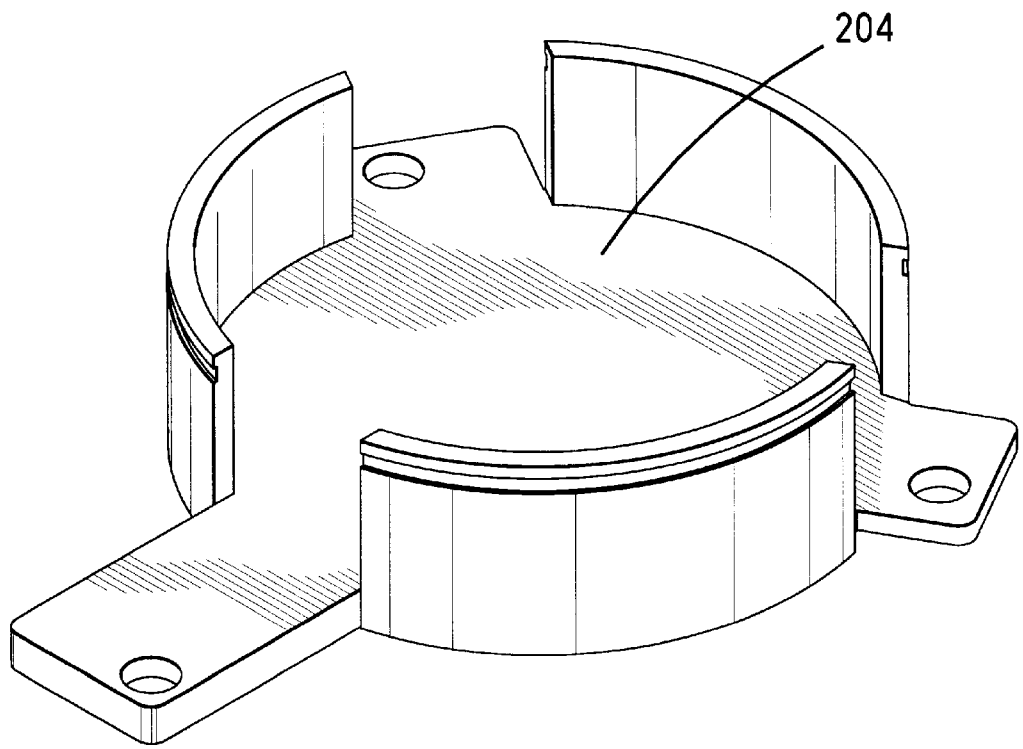

Turning to FIGS. 2a and 2b the housing member 201 for the ferrite Isolator/Circulator is shown. The housing 201 is fabricated from a metal that allows the conduction of magnetic energy for example cold rolled steel and specific grades of stainless steel. The important feature is rigidity. The lead supports for the contacts of the ferrite Isolator/Circulator are shown at 202 and provide support for the Isolator/Circulator leads and connections thereto. Holes are disposed as shown at 203 for supporting the leads as well as the dielectric material which is press fit therein thereby isolating the leads from the metal housing 201. The bottom surface of the metal housing 204 provides contact to electrical ground in the Isolator/Circulator structure.

Figure 1A:
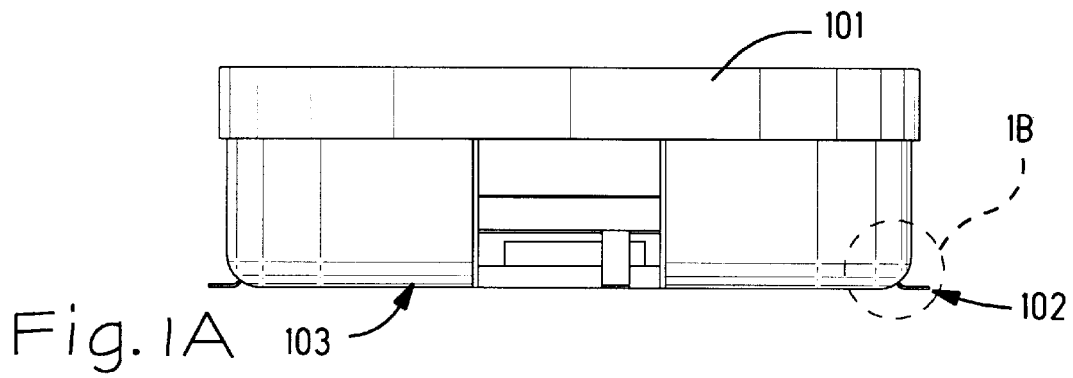
FIGS. 1a–1c show a conventional ferrite Isolator/Circulator in a housing member having the resilient contact leads.
Figure 1B:
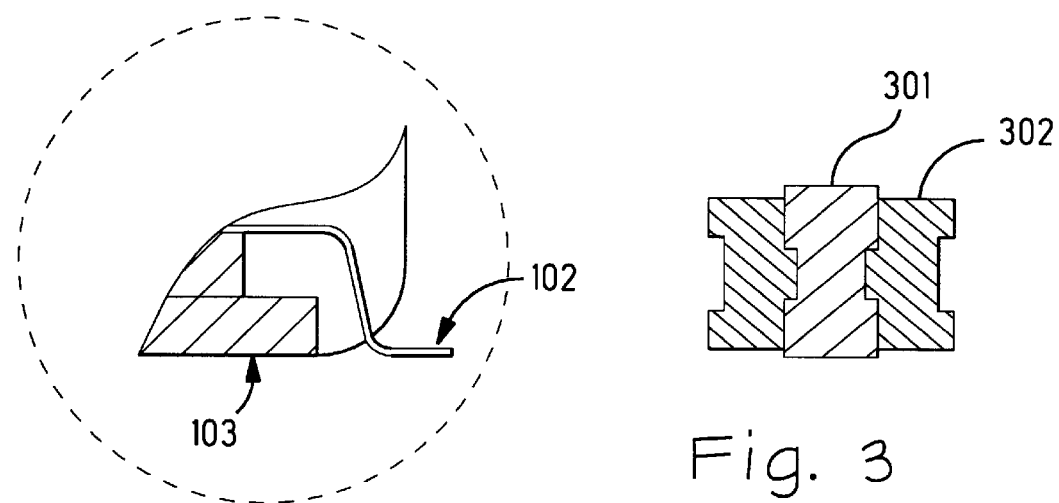
Figure 3:
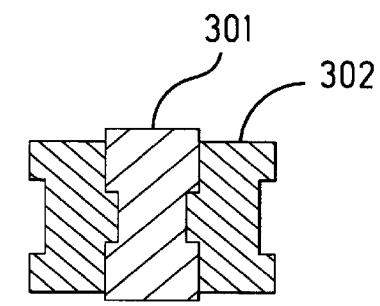
FIG. 3 is a cross sectional view of the press fit contact with the dielectric material serving as a insulator between the support leads of the housing and the contact.
Figure 1C:
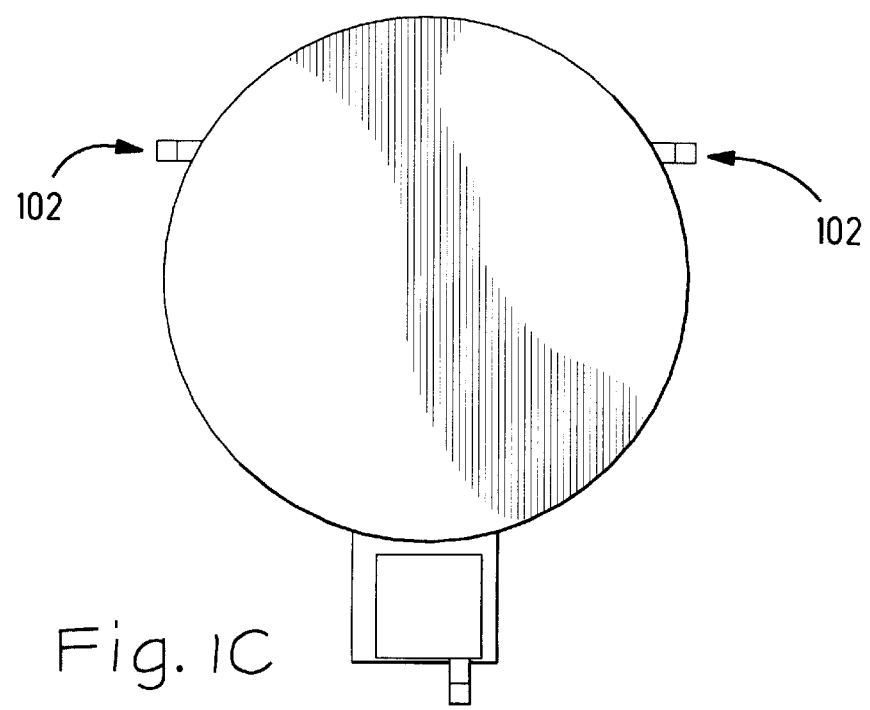
Figure 4:
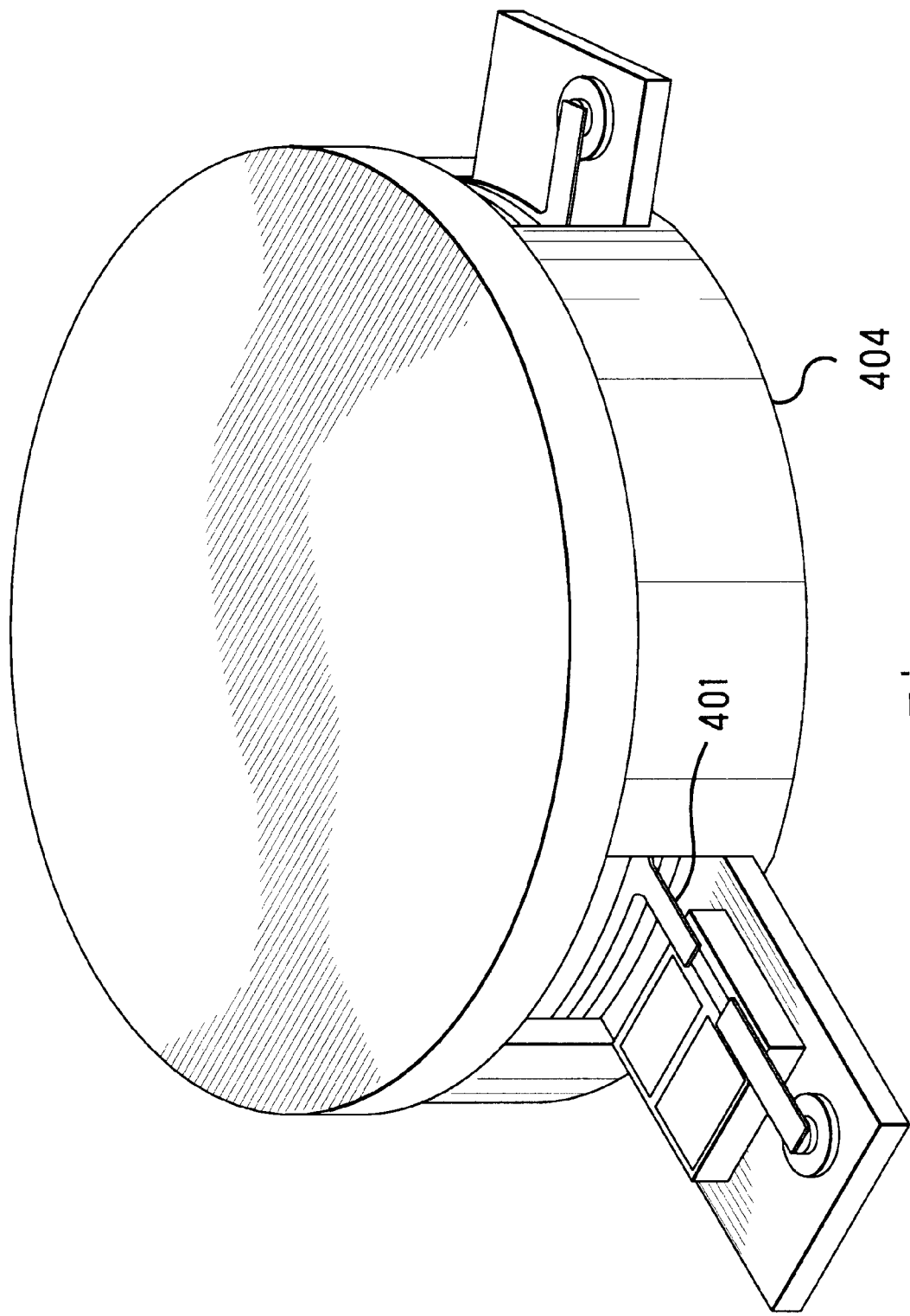
FIG. 4 is an isometric view of the preferred embodiment of the present disclosure.

FIG. 3 shows the contact 301 for surface mount connection between the Isolator/Circulator and the signal transmission lines disposed on the printed circuit board. The contact 301, fabricated from preferably beryllium copper, copper or any other suitable conductor of electricity, is disposed in a dielectric material 302. The dielectric material 302 serves to isolate the contact 301 from the housing 201. The dielectric material 302 may be over-molded on the contact 301. The preferred embodiment is an under cut in the center of the contact 301 to ensure one piece-like construction. The contact 301 is thereafter disposed into the holes in the lead support member 202 at 203. The final product is as shown in FIG. 4. To this end, the lead support member 202 has the dielectric material 302 press fit into the hole 203 with the contact member 301 as shown. The contact 301 is connected to the microstrip line 401 of the Isolator/Circulator (not shown). The resultant product as shown in FIG. 4 has the contact 301 substantially coplanar with the bottom of the housing member 201 as shown in FIG. 4 at 404. By virtue of the fact that the lead supports 202 are very rugged in nature, once the coplanar relationship between the bottom of the contact 301 and the bottom of the can 404 is established, it is unnecessary to make any adjustments to assure a proper surface mount on the printed circuit board. This is, of course, one of the true advantages of the present invention in that once the device is mounted to the printed circuit board, a true flush circuit surface mount structure is effected between the electrical ground and member 404 as well as between the respective signal lines (not shown) and the bottom of the contact 301.

Turning to FIGS. 5a and 5b, an alternative structure is shown to the present invention. This structure has a dielectric support member 501 with a hole therein at 502 for aligning the ferrite material and center conductor for the Isolator/Circulator. The dielectric support member like the other dielectric materials of the present invention requires durability at relatively high temperatures due to the soldering processes that take place during manufacture. A suitable material is for example a dielectric sold under the trademark Forton™ which enables solder reflow at temperatures of greater than 260 degree Celsius. The use of the dielectric insert as shown in FIG. 5 enables a standard can for the housing into which the ferrite is disposed. That is to say, the standard can may be used with the ferrite material disposed in the dielectric support and the dielectric support thereafter mounting appropriately in the can as necessary for various applications.

Additionally, it is possible to have a variety of structures for the housing member as well as for the contact members. To this end, it is also possible to have a slot as opposed to a hole in the lead support members as shown at 203 in FIG. 2. These slotted lead support members may be necessary to: (1) avoid solder joint breakage, (2) or to aid in assembly. In some instances, thermal expansion tendencies of components used in the circulator unit require that some movement be allowed of the contact pin relative to the support structure of the unit. A slot will serve this purpose in that the contact assembly is allowed to move in a direction that would be induced by thermal expansion of the various components. Possible variances of thermal expansion coefficients and a designed amount of thermal expansion rates therefore requires free distances. In some cases, also, a slot may be useful in that it is perpendicular to the height requiring coplanarity radial to the unit center, although other directions of assembly of the contact pin in the housing may be acceptable.

The invention having been described in detail it is clear that there are variations and modifications to this disclosure here and above which will be readily apparent to one of ordinary skill in the art. To the extent that such variations and modifications of the present disclosure of a rugged structure for ferrite Isolator/Circulator having contact members which are supported by rugged lead support members and result in a product which result is substantially surface mount in nature requiring very little adjustment during manufacture, such are deemed within the scope of the present invention.

We claim:

1. A structure for a passive microwave device, comprising:
    a housing having circumferential side portions and selectively located openings in said side portions wherein electrical conductors for the passive device extend from said openings;
    substantially rigid supports for providing structural support for said conductors wherein said conductors are positioned above said supports and are electrically connected at one end to contacts which are secured in apertures formed in said supports; and
    a dielectric material disposed on a perimeter of said contact for isolating said contact from said support when said contact is positioned within said aperture.

2. A structure as recited in claim 1, wherein said contacts are exposed at bottom surfaces thereof.

3. A structure as recited in claim 2, wherein said housing has a bottom surface for effecting electrical ground, and said bottom surfaces of said contacts are substantially flush with said bottom surface of said housing.

4. A structure as recited in claim 1, wherein said housing has disposed therein a ferrite isolator.

5. A structure as recited in claim 1, wherein said housing has disposed therein a ferrite circulator.

6. A structure as recited in claim 1, wherein said housing is metal.

7. A structure for a passive microwave device, comprising;
- a housing having openings for reception of electrical conductors,
- substantially rigid contact supports extending from said openings;
- electrical conductors extending through said openings and above said supports wherein an end of said conductors extends through apertures formed in said supports, and wherein a perimeter of said conductors at said end includes dielectric material disposed thereon for isolating said conductors from said supports; and
- said housing having a bottom surface, wherein said conductors and said bottom surface of said housing are substantially flush.

8. A structure as recited in claim 7, wherein said housing is metal.

* * * * *